United States Patent
Neuhauser et al.

(10) Patent No.: US 10,082,296 B2
(45) Date of Patent: Sep. 25, 2018

(54) OPERATING DEVICE FOR DOMESTIC APPLIANCE

(71) Applicant: BSH Hausgeräte GmbH, Munich (DE)

(72) Inventors: Maximilian Neuhauser, Chieming/Egerer (DE); Manfred Plankl, Traunwalchen (DE); Karl Reindl, Regensburg (DE); Carsten Zei, Sinzing (DE)

(73) Assignee: BSH Hausgeräte GmbH, Munich (DE)

( * ) Notice: Subject to any disclaimer, the term of this patent is extended or adjusted under 35 U.S.C. 154(b) by 0 days.

(21) Appl. No.: 15/110,423

(22) PCT Filed: Dec. 29, 2014

(86) PCT No.: PCT/EP2014/079363
§ 371 (c)(1),
(2) Date: Jul. 8, 2016

(87) PCT Pub. No.: WO2015/104194
PCT Pub. Date: Jul. 16, 2015

(65) Prior Publication Data
US 2016/0334110 A1  Nov. 17, 2016

(30) Foreign Application Priority Data
Jan. 10, 2014  (DE) .......... 10 2014 200 316

(51) Int. Cl.
*H05B 1/02* (2006.01)
*F24C 7/08* (2006.01)
(Continued)

(52) U.S. Cl.
CPC ............. *F24C 7/08* (2013.01); *H03K 17/962* (2013.01); *D06F 39/005* (2013.01); *H03K 2217/96079* (2013.01); *H03K 2217/960755* (2013.01)

(58) Field of Classification Search
CPC .................. F24C 7/08; H03K 17/962; H03K 2217/960755; H03K 2217/96079;
(Continued)

(56) References Cited

U.S. PATENT DOCUMENTS

2007/0068789 A1  3/2007  Streifler
2009/0115645 A1  5/2009  Roth
(Continued)

FOREIGN PATENT DOCUMENTS

CN  102089588 A  6/2011
DE  102004038752 A1  2/2006
(Continued)

OTHER PUBLICATIONS

International Search Report PCT/EP2014/079363 dated May 13, 2015.
Report of Examination EP 14 825 156.4 dated May 29, 2018.

*Primary Examiner* — Mark Paschall
(74) *Attorney, Agent, or Firm* — Michael E. Tschupp; Andre Pallapies; Brandon G. Braun

(57) ABSTRACT

An operating device includes at least one panel unit which has at least one operating region and a lighting unit configured to back-light and/or to transilluminate the at least one operating region. A sensor unit including at least one at least partly transparent support element and at least one sensor element which is arranged on the at least one support element as an etched structure is arranged at least partly between the lighting unit and the panel unit.

24 Claims, 2 Drawing Sheets

(51) Int. Cl.
*H03K 17/96* (2006.01)
*D06F 39/00* (2006.01)

(58) Field of Classification Search
CPC ... D06F 39/005; H05B 1/0263; H05B 1/0266; H05B 3/0075
USPC .... 219/482, 506, 497, 412–414, 446.1, 494, 219/502
See application file for complete search history.

(56) References Cited

U.S. PATENT DOCUMENTS

| | | | |
|---|---|---|---|
| 2010/0020534 A1 | 1/2010 | Isoda et al. | |
| 2013/0033450 A1* | 2/2013 | Coulson | G06F 3/044 345/174 |
| 2014/0062933 A1* | 3/2014 | Coulson | G06F 3/044 345/174 |

FOREIGN PATENT DOCUMENTS

| | | |
|---|---|---|
| WO | 2011160960 A1 | 12/2011 |
| WO | 2012076411 A3 | 6/2012 |

* cited by examiner

OPERATING DEVICE FOR DOMESTIC APPLIANCE

CROSS-REFERENCES TO RELATED APPLICATIONS

This application is the U.S. National Stage of International Application No. PCT/EP2014/079363, filed Dec. 29, 2014, which designated the United States and has been published as International Publication No. WO 2015/104194 and which claims the priority of German Patent Application, Serial No. 10 2014 200 316.4, filed Jan. 10, 2014, pursuant to 35 U.S.C. 119(a)-(d).

BACKGROUND OF THE INVENTION

Touch-sensitive and/or approach-sensitive operating devices with a front panel which has a marking, and a light source which is designed to back-light the marking are known.

Furthermore, an operating device for a domestic appliance is known from DE 10 2004 038 752 B4, which has a control panel with a touch pad, an LED display and a sensor unit, wherein the sensor unit comprises a carrier film and a sensor element and the sensor element is arranged on the carrier film as an etched structure.

BRIEF SUMMARY OF THE INVENTION

The object of the invention is in particular to provide an operating device of this type for a domestic appliance with improved properties with regard to the freedom of design and/or the operability. The object is achieved by the features of claim 1, while advantageous embodiments and developments of the invention can be found in the subclaims.

An operating device for a domestic appliance with a panel unit which has at least one operating region with a lighting unit which is provided to back-light and/or transilluminate at least one operating region, with a sensor unit which has at least one at least partly transparent support element and at least one sensor element which is arranged on the at least one support element as an etched structure is proposed, wherein the sensor unit is arranged at least partly between the lighting unit and the panel unit.

An "operating device for a domestic appliance" should be understood to mean in particular at least a part, in particular a subassembly, of a domestic appliance, which in particular is provided for the operation of the domestic appliance. The domestic appliance may be designed as an arbitrary domestic appliance deemed reasonable by a person skilled in the art, in particular as a cooking appliance, in particular an oven, a steam cooker, a stovetop, a microwave and/or a toaster, a washing device, in particular, a dishwasher and/or a washing machine, and/or a cooling device, in particular a refrigerator, an upright freezer and/or a chest freezer. In addition, in this context a "panel unit" should in particular be understood to mean a structural unit which has at least one component, in particular at least one cover plate, which is provided to cover and/or close the operating device for a domestic appliance and in particular the domestic appliance in at least one direction. In particular, the panel unit serves to protect the operating device for a domestic appliance and/or the sensor unit. Advantageously, the panel unit is designed integrally. In particular, the panel unit can be designed integrally with a stovetop. "Integrally" should in this context in particular be understood to mean at least firmly bonded. The adhesive bond may, for example, be produced by an adhesive process, an injection process and/or another process deemed reasonable by a person skilled in the art. Advantageously, however, integrally should be understood to mean formed in one piece. Preferably this one piece is produced from a single element while at least part of the panel unit is in particular designed at least partly transparently, in particular in at least the vicinity of the at least one operating region. In particular, the panel unit has at least one electrically insulating material and preferably comprises, at least essentially, an electrically insulating material, for example, glass, glass ceramic and/or a plastic. In this context, "at least essentially" consisting of a material should in particular be understood to mean that an element consists of this material with a proportion of at least 70%, preferably of at least 80% and particularly preferably of at least 90%. Advantageously, the panel unit and/or the at least one component is at least essentially flat in design. Particularly advantageously, the panel unit and/or the at least one component is at least essentially plate-like in design. In this context an "at least essentially" flat object should be understood to mean an object which differs with a proportion of 30% maximum, advantageously 20% maximum, preferably 10% maximum and particularly preferably 5% maximum from an object which has a flat and/or curved shape and in particular a material thickness of 5 mm maximum, advantageously of 3 mm maximum, preferably of 1 mm maximum and particularly preferably of 0.5 mm maximum. An "at least essentially" plate-like embodiment of an object should in particular be understood as an embodiment of the object in which a minimal geometric cuboid still enveloping the object has a longest edge which is at least five times, in particular at least ten times, preferably at least fifteen times and particularly advantageously at least twenty times as long as the shortest edge of the cuboid. A material thickness and/or a length of a shortest edge of a minimal geometric cuboid still enveloping the object, defines, in particular, the thickness of the object. In addition, a longest edge of a minimal geometric cuboid still enveloping the object, in particular, defines the length of the object. A length of a medial edge of a minimum geometric cuboid still enveloping the object defines, in particular, the width of the object. The panel unit is preferably arranged such that at least one ray of light emanating from the lighting unit penetrates the smallest extension and/or thickness of the panel unit and/or of the at least one component, in particular, at least essentially parallel to the extension and/or the thickness. What should be understood by "at least essentially" parallel is, in particular, an alignment of a direction relative to a reference direction, in particular on a plane, wherein the direction opposite the reference direction has a deviation in particular less than 8°, advantageously less than 5° and particularly advantageously less than 2°. Furthermore, a "lighting unit" should be understood to mean in particular a unit which in at least one operating state is intended to provide and/or guide light. In particular, the lighting unit comprises at least one light guide and/or preferably at least one light source. The at least one light source may, for example, be designed as an electroluminescent wire, LED and/or OLED. In addition, the lighting unit and/or the at least one light source can in particular be intended to provide monochromatic and/or polychromatic light. In particular, the lighting unit and/or the at least one light source can also be intended to provide light of varying brightness. In addition, an "operating region" should be understood to mean in particular a surface area which in particular is arranged on a surface of the panel unit and in particular on a surface of the domestic appliance. In particular, the at least one operating region embodies at least one control surface. In particular, the at least one operating region is intended to be touched by an operator for an operator input and/or to be activated by at least approach. In particular, the at least one control surface can have a flat shape, a convex shape and/or an at least partly curved shape in at least one operating state.

In particular, the at least one operating region and/or the at least one control surface can be intended to display at least one position in at least one operating state, preferably a control position, a function and/or an operating state of the operating device for a domestic appliance and/or of the domestic appliance and/or the sensor unit, in particular based on transillumination and/or back-lighting. The lighting unit in particular can be intended to display an operating state of the operating device for a domestic appliance and/or of the domestic appliance by means of varying brightness and/or different luminous paint. A proportion and/or a limitation of the at least one operating region can in particular be characterized by back-lighting and/or preferably by a marking. The at least one marking can in particular have a symbol and/or a pictogram, and in particular be embodied as a symbol and/or marking. In particular, the at least one operating region has a surface extension of at least $0.1$ $cm^2$, advantageously of at least $0.5$ $cm^2$, preferably of at least $1$ $cm^2$ and particularly preferably of at least $2$ $cm^2$ and in particular of $15$ $cm^2$ maximum, advantageously of $10$ $cm^2$ maximum, preferably of $7$ $cm^2$ maximum and particularly preferably of $5$ $cm^2$ maximum. Furthermore, a "sensor element" should in particular be understood to mean a preferably at least essentially flat and particularly preferably at least essentially plate-like element which is provided to indirectly and/or directly detect touch and/or approach, preferably touch of the at least one operating region and/or approach of the at least one operating region. Detection can, for example, take place inductively, resistively and/or preferably capacitively. The at least one sensor element may consist of any electrically conductive material deemed reasonable by a person skilled in the art. In particular, the at least one sensor element may surround recesses and/or cavities. The at least one sensor element in particular has a surface extension, in particular, a surface extension of an external contour, of at least $0.2$ $cm^2$, advantageously of at least $0.6$ $cm^2$, preferably of at least $1.1$ $cm^2$ and particularly preferably of at least $2.1$ $cm^2$ and in particular of $20$ $cm^2$ maximum, advantageously of $15$ $cm^2$ maximum, preferably of $10$ $cm^2$ maximum and particularly preferably of $6$ $cm^2$ maximum. In particular, the at least one sensor element and/or an external contour of the at least one sensor element has a greater surface extension than the at least one operating region and/or the at least one marking. Preferably the sensor unit also has an additional protective layer which encloses the at least one sensor element and in particular is intended to protect the at least one sensor element. The protective layer may in particular have a film and/or a protective varnish and preferably be embodied thereof. A "support element" should further be understood to mean, in particular, an at least essentially flat and preferably at least essentially plate-like element which in particular has at least one reception area on which in particular, at least in a mounted state, the at least one sensor element is arranged. In particular, precisely one sensor element or even several sensor elements may also be arranged on the at least one reception area. In particular, the support element consists at least essentially of an electrically insulating material, in particular at least essentially of a plastic, preferably of polyethylene terephthalate (PET) and/or polyethylene naphthalate (PEN). That an object is "at least partly transparent" in design should in particular be understood to mean that the object has at least a partial area which for at least one wavelength range is preferably in the visible light spectrum, at least partly transparent and/or at least translucent. In addition, an "etched structure" should be understood to mean in particular a structure which is produced by means of etching, in particular chemical etching. The sensor unit is preferably arranged between the lighting unit and the panel unit with a proportion of at least 50%, in particular of at least 70% and particularly preferably of at least 90%. That the sensor unit is arranged "between" the lighting unit and the panel unit should be understood to mean in this context in particular that there is at least one straight line which intersects at least one point of the sensor element, at least one point of the panel unit and at least one point of the lighting unit. Preferably, the sensor unit and/or at least the at least one sensor element is at least essentially plate-like in design and in particular has a main extension plane which in particular is parallel to the largest lateral surface extension of a minimal geometric cuboid which barely encloses the sensor unit and/or the at least one sensor element completely, and passes through the center of the cuboid. In this case, at least part of the panel unit, in particular the at least one operating region, preferably the entire panel unit, and the lighting unit, preferably the at least one light source, are arranged on different sides of the main extension plane of the sensor unit and/or at least of the at least one sensor element.

By means of this embodiment, in particular the freedom of design and/or the operability can be improved. In particular, an operating state and/or a property of the domestic appliance operating device can be advantageously displayed. In addition, through the use of known wire technology methods, in particular for the production of the support element, the costs and workload can be reduced. Advantageously, space can also be saved in the process.

The at least one sensor element can in particular consist of an at least essentially transparent and/or translucent material, such as in particular a conductive polymer and/or indium tin oxide. Advantageously, however, the at least one sensor element is at least essentially and preferably completely opaque. That an object is "at least essentially" opaque should in this context in particular be understood to mean that the object is opaque to light with a proportion of at least 50%, preferably of at least 70% and particularly preferably of at least 90%. In particular, the at least one sensor element may, for example, consist at least essentially of silver and/or at least essentially of aluminum. Preferably, however, the at least one sensor element consists at least essentially of copper and/or a copper alloy. By this means, in particular designs can be enabled which can otherwise only be achieved with transparent materials. In addition, costs can be reduced advantageously.

In addition, it is proposed that the at least one sensor element has a plurality, in particular at least two electrically interconnected conductor tracks. Preferably the conductor tracks are interconnected via at least one connection conductor, advantageously in a peripheral area. At least one connection conductor preferably has a greater line width than at least one of the conductor tracks and is preferably made of the same material as the conductor tracks. By this means, in particular a cost-effective sensor unit can be obtained.

If the conductor tracks, in particular at least two, preferably at least four conductor tracks, are arranged at least essentially in parallel and/or at least essentially in a grid shape, a sensor element can in particular be structurally simple in design and detection is advantageously improved.

Furthermore, it is proposed that the conductor tracks have a line width of between 0.01 mm and 0.6 mm, preferably between 0.03 mm and 0.4 mm and particularly preferably between 0.05 mm and 0.3 mm. Hereby, in particular, a production process of the sensor unit can be simplified as advantageously known wire technology methods can be used.

In addition, it is proposed that the conductor tracks are at a mutual distance of between 0.05 mm and 1 mm, preferably between 0.08 mm and 0.8 mm and particularly preferably between 0.1 mm and 0.5 mm. Hereby, in particular, the sensitivity of the sensor element and in particular an invisible proportion, at least to the human eye, of the sensor unit can be tailored to specific requirements.

In an embodiment of the invention it is proposed that the at least one sensor element occupies between 10% and 85%, preferably between 15% and 70% and particularly preferably between 20% and 50%, of a total area of the at least one support element. Hereby, the sensitivity of the sensor element can be advantageously further improved.

In a particularly preferable embodiment of the invention it is proposed that there is at least one straight line which intersects at least one point of the sensor element, at least one point of the operating region, in particular one point of the at least one, in particular optional, marking of the operating region, and at least one point of the lighting unit, advantageously of the at least one light source. Hereby, space can be saved and the freedom of design increased advantageously.

Advantageously, the at least one support element is at least essentially flexible. The phrase "at least essentially" flexible should in this context in particular be understood to mean that the at least one support element is flexible with a proportion of at least 50%, preferably of at least 70% and particularly preferably of at least 90%. The term "flexible" should in particular be understood to mean that the at least one support element has at least one extension, preferably two extensions, preferably a length and/or a width which, in particular, can be elastically changed by at least 10%, advantageously by at least 25%, preferably by at least 40% and particularly preferably by at least 60%. Advantageously, the at least one support element is embodied as a film and in particular has a thickness of between 10 µm and 500 µm, preferably between 30 µm and 300 µm and particularly preferably between 50 µm and 100 µm. Hereby the sensor unit and/or the domestic appliance operating device can be advantageously adjusted to a three-dimensional structure. In addition, the freedom of design can be further increased advantageously.

In addition, it is proposed that the sensor unit has at least one supply line which is arranged on the at least one support element as an etched structure. In particular, the supply line can be produced in the same step as the at least one sensor element. In this context, a "supply line" should be understood to mean in particular an electrically conductive connection which is provided to connect the sensor unit to an analysis unit and/or a control unit indirectly and/or directly. Hereby, in particular, the amount of work can be reduced. In addition, costs may be further reduced.

Advantageously, the domestic appliance operating device has at least one, preferably at least essentially flat, diffuser which is provided to prevent a direct view of the at least one sensor element. A "diffuser" in this context should, in particular, be understood to mean an at least partly transparent, preferably translucent, element, preferably a coating, printing and/or a film which is provided to transmit light as diffuse light and thus, in particular, to generate a blurred image of an underlying object. The diffuse light may, for example, be generated by a coarse surface. In addition, the diffuse light may also be generated by a specific coating, imprint and/or film, wherein the material used has scattering particles, such as in particular calcium phosphate, fluoride and/or tin oxide. Hereby, in particular, the variety of designs for the domestic appliance operating device can be further increased.

If the at least one support element is integrally designed with the at least one diffuser, in particular, the overall height can be reduced and costs saved.

Further advantages are revealed by the following diagrammatic description. The diagram shows two exemplary embodiments of the invention. The diagram, the description and the claims contain a combination of numerous features. A person skilled in the art will also expediently consider the features individually and combine them to form further useful combinations.

BRIEF DESCRIPTION OF THE DRAWINGS

The diagram shows.

DETAILED DESCRIPTION OF EXEMPLARY EMBODIMENTS OF THE PRESENT INVENTION

Figure 1:
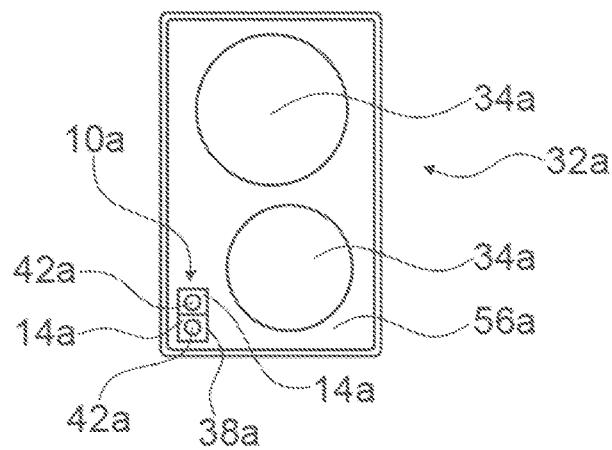
FIG. 1 A diagrammatic view of a domestic appliance with an operating device for a domestic appliance which has a panel unit, FIG. 2 An enlarged partial view of the panel unit and of a diffuser of the operating device for a domestic appliance in a lateral cutaway view, FIG. 3 A diagrammatic view of a sensor unit of the operating device for a domestic appliance with two sensor elements, FIG. 4 A diagrammatic view of the entire operating device for a domestic appliance in a lateral cutaway view and FIG. 5 A further operating device for a domestic appliance with an alternative sensor unit in a lateral cutaway view.

FIG. 1 shows an exemplary domestic appliance 32a designed as a stovetop in a diagrammatic top view. The domestic appliance 32a has a stovetop 56a with two heating zones 34a. In addition, the domestic appliance 32a has an operating device for a domestic appliance. The domestic appliance operating device serves for the input and/or selection of a performance level by a user. Furthermore, the domestic appliance operating device has a control unit (not shown). The control unit is intended to control the domestic appliance operating device and/or to analyze operator input.

Figure 2:
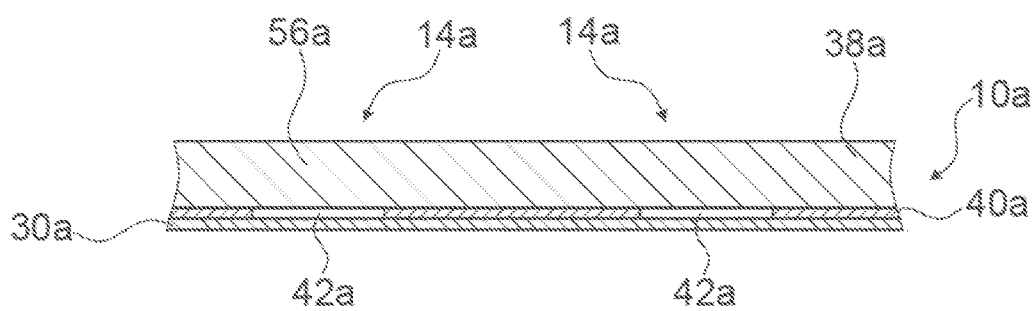

The domestic appliance operating device has a panel unit 10a (cf. also FIG. 2). The panel unit 10a is at least partly integrally designed with the hotplate 56a. The panel unit 10a has in the present case a thickness of 4 mm. In the present case the panel unit 10a has a glass ceramic plate 38a. The glass ceramic plate 38a is at least partly designed as a user interface. In the present case the glass ceramic plate 38a is at least partly transparent. The glass ceramic plate 38a has several operating regions 14a. In the present case, the glass ceramic plate 38a has two operating regions 14a. In the present case the operating regions 14a are designed as touch-sensitive operating regions 14a. The operating regions 14a are arranged on an upper side of the glass ceramic plate 38a. The operating regions 14a are intended to be activated through contact by an operator. Each operating region 14a is assigned to one of the heating zones 34a. The operating regions 14a are flat in design. In the present case the operating regions 14a are identical to one another.

In addition, the panel unit 10a has a coating 40a. The coating 40a is arranged on an underside of the glass ceramic plate 38a. The coating 40a is opaque. In the present case the coating 40a is black. The coating 40a essentially extends over the entire glass ceramic plate 38a. The coating 40a has several recesses. In the present case the coating 40a has two recesses. Each of the recesses is assigned to one of the operating regions 14a. The recesses form two markings 42a. In the present case the markings 42a are therefore formed by recesses in the coating 40a. In the present case the markings 42a are therefore in particular completely transparent. The markings 42a are identical to one another. In the present case the markings 42a are round in shape. The markings 42a have a radius of approximately 0.5 cm. The markings 42a therefore have a surface extension of approximately 0.8 cm$^2$.

Alternatively, a marking may also be formed by a recess and/or a hole of printing, a film and/or laser printing. In addition, it is conceivable that at least one marking is formed by a coating, printing, a film, laser printing and/or in another manner deemed reasonable by a person skilled in the art. In particular, at least one marking may also be partly transparent and/or opaque. In addition, at least one marking may have any shape deemed reasonable by a person skilled in the art, such as in particular a square shape, a rectangular shape, the shape of a symbol and/or the shape of a pictogram.

In addition, the domestic appliance operating device has a diffuser 30a. The diffuser 30a is arranged, in particular directly, beneath the panel unit 10a and/or beneath the coating 40a. The diffuser 30a is intended to prevent a direct view of a sensor unit 16a. The diffuser 30a is at least essentially transparent. In the present case the diffuser 30a is translucent. The diffuser 30a is therefore permeable to light. In addition, however, the diffuser 30a is opaque. In the present case the diffuser 30a is made of plastic. The diffuser 30a is flat in design. In the present case the diffuser 30a is designed as a film. Alternatively, a diffuser may also be designed as printing and/or a coating, in particular on a panel unit. In the present case the diffuser 30a is bonded, in particular directly, beneath the panel unit 10a and/or beneath the coating 40a. Alternatively, it is also conceivable to clamp instead of bond a diffuser.

Figure 3:
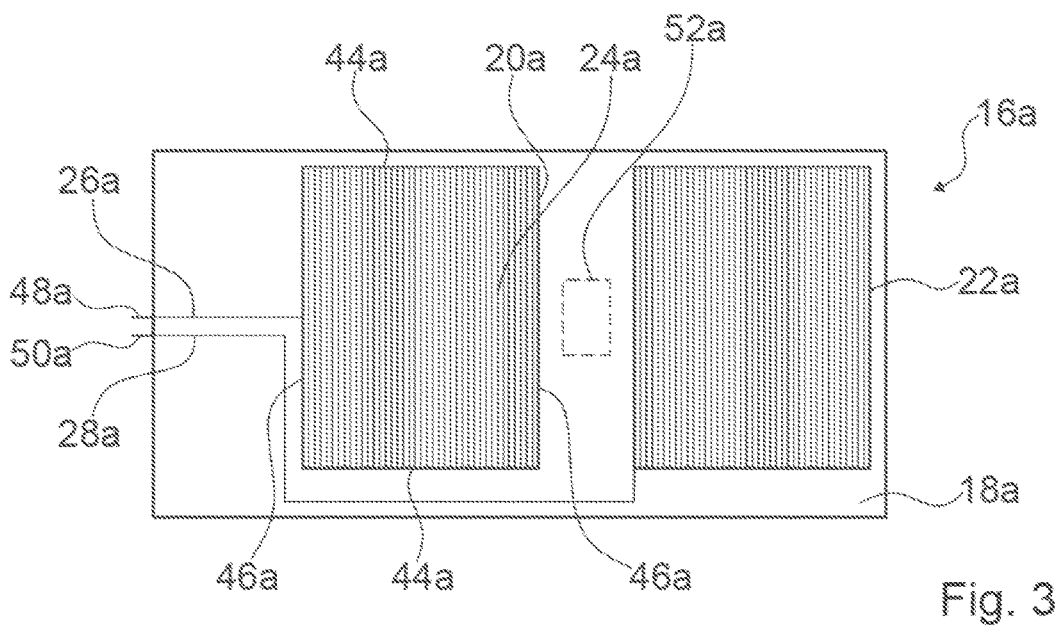

FIG. 3 shows a diagrammatic view of the sensor unit 16a of the domestic appliance operating device. The sensor unit 16a has a support element 18a. The support element 18a is flat in design. The support element 18a is designed as a film. In the present case the support element 18a has a thickness of 80 µm auf. In the present case the support element 18a is therefore flexible. The support element 18a is furthermore completely transparent. The support element 18a is made of plastic. In the present case the support element 18a is made of PEN. In addition, the support element 18a has a rectangular external contour. The support element 18a has a length of approximately 4 cm and a width of approximately 2 cm. The support element 18a therefore has a surface extension of approximately 8 cm$^2$.

Furthermore, the sensor unit 16a has several sensor elements 20a, 22a. The sensor elements 20a, 22a are arranged on the support element 18a, in particular an upper side and/or underside of the support element 18a. In the present case two sensor elements 20a, 22a are arranged on the support element 18a. Each of the sensor elements 20a, 22a is assigned to one of the markings 42a. The sensor elements 20a, 22a are identical to one another. The sensor elements 20a, 22a are arranged on the support element 18a as an etched structure. The sensor elements 20a, 22a are therefore etched directly onto the support element 18a. The sensor elements 20a, 22a are flat in design. The sensor elements 20a, 22a consist of an electrically conductive material. In the present case the sensor elements 20a, 22a are made of copper. In the present case the sensor elements 20a, 22a therefore opaque. Each of the sensor elements 20a, 22a has a plurality of electrically interconnected conductor tracks 24a. For the sake of clarity, in the present case only one conductor track has a reference character. In the present case each of the sensor elements 20a, 22a has forty conductor tracks 24a. The conductor tracks 24a of one of the sensor elements 20a, 22a are arranged in parallel. In the present case the conductor tracks 24a have a line width of 0.1 mm. The conductor tracks 24a are at a mutual distance of 0.3 mm. Furthermore, the conductor tracks 24a have a thickness of 18 µm. The conductor tracks 24a and/or the sensor elements 20a, 22a are therefore visible to the naked eye.

Furthermore, in the present case each sensor element 20a, 22a has four connection conductors 44a, 46a which in particular for the sake of clarity only have a reference character in one of the sensor elements 20a, 22a. Each of the sensor elements 20a, 22a therefore consists of conductor tracks 24a and connection conductors 44a, 46a. In the present case the connection conductors 44a, 46a have a greater line width than the conductor tracks 24a. The connection conductors 44a, 46a have a line width of 0.2 mm. Two of the connection conductors 46a are arranged in parallel to the conductor tracks 24a of one of the sensor elements 20a, 22a. The two other connection conductors 44a are arranged vertically to the conductor tracks 24a of one of the sensor elements 20a, 22a. The vertical connection conductors 44a are intended to connect the conductor tracks 24a of one of the sensor elements 20a, 22a to each other, in particular electrically conductively, in their peripheral areas. Alternatively, it is also conceivable that at least one sensor element only has one connection conductor, in particular a vertical connection conductor. In addition, it is conceivable that at least one connection conductor is at any angle to conductor tracks of a sensor element. In the present case the connection conductors 44a, 46a determine an external contour of one of the sensor elements 20a, 22a. In the present case the sensor elements 20a, 22a have a rectangular external contour. The external contour of one of the sensor elements 20a, 22a has a width of 1.6 cm and a length of 1.9 cm. The external contour of one of the sensor elements 20a, 22a therefore includes a surface extension of approximately 3 cm$^2$. Alternatively, at least one sensor element may also have a square, a round and/or another shape deemed reasonable by a person skilled in the art. A pure material surface, in particular an electrically conductive material, of one of the sensor elements 20a, 22a occupies a surface extension of approximately 0.8 cm$^2$. In the present case one of the sensor elements 20a, 22a therefore occupies approximately 10% of the total area of the support element 18a. In addition, both sensor elements 20a, 22a are identical, both the sensor elements 20a, 22a thus occupying approximately 20% of the total area of the support element 18a.

In the present case, furthermore, the sensor unit 16a has an additional protective layer (not shown). The protective layer encloses at least one of the sensor elements 20a, 22a. In the present case the protective layer encloses both the sensor elements 20a, 22a. In the present case the protective layer is a protective varnish. The protective layer is transparent.

In addition, the sensor unit 16a has several supply lines 26a, 28a. The supply lines 26a, 28a are arranged on the support element 18a. In the present case two supply lines 26a, 28a are arranged on the support element 18a. The supply lines 26a, 28a are arranged on the support element 18a as an etched structure. The supply lines 26a, 28a are therefore etched directly onto the support element 18a. The supply lines 26a, 28a and the sensor elements 20a, 22a are etched onto the support element 18a in the same step. The supply lines 26a, 28a consist of an electrically conductive material. In the present case the supply lines 26a, 28a are made of copper. The supply lines 26a, 28a in the present case have a line width of 0.15 mm. The supply lines 26a, 28a have a thickness of 18 μm. The supply lines 26a, 28a are therefore opaque in the present case. In addition, the supply lines 26a, 28a are visible to the naked eye. Each of the supply lines 26a, 28a is assigned to one of the sensor elements 20a, 22a. Each of the supply lines 26a, 28a is connected by a free end to one of the connection conductors 44a, 46a, in particular electrically conductively. In the present case each of the supply lines 26a, 28a is connected to the vertical connection conductor 44a, in particular electrically conductively. In the present case, a second free end of each of the supply lines 26a, 28a has a connection 48a, 50a. The connection 48a, 50a is intended to connect the sensor elements 20a, 22a indirectly and/or directly to the control unit.

Figure 4:
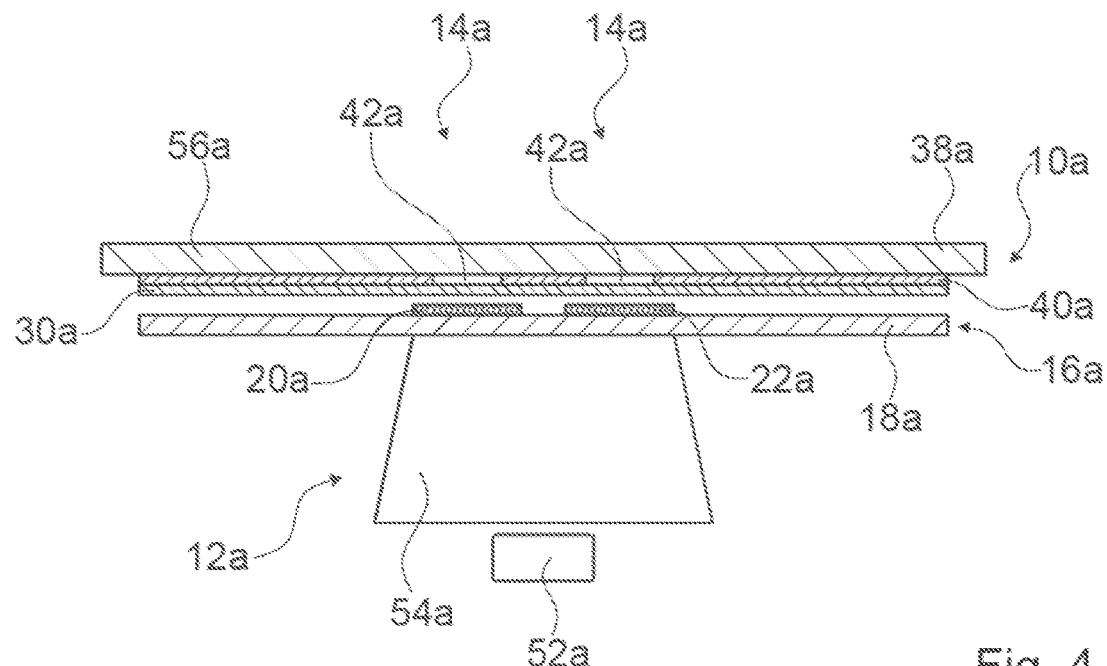

FIG. 4 now shows a diagrammatic view of the domestic appliance operating device with the panel unit 10a, the diffuser 30a, the sensor unit 16a, which is only shown diagrammatically as a surface, and a lighting unit 12a in a lateral cutaway view.

The domestic appliance operating device has a lighting unit 12a. The lighting unit 12a has a light source 52a. The light source 52a is designed as an LED, in particular using SMD technology. The light source 52a is intended to provide light of varying brightness. In addition, the lighting unit 12a has a light guide 54a. The light guide 54a is intended to homogenize the light of the light source 52a. In addition, the sensor unit 16a is arranged above the lighting unit 12a. The sensor unit 16a is fastened directly to the light guide 54a. In the present case the support element 18a is bonded directly to the light guide 54a. The sensor unit 16a is arranged such that the light source 52a is arranged at least essentially centrally beneath the two sensor elements 20a, 22a (cf. also FIG. 3).

The lighting unit 12a and/or the sensor unit 16a is arranged beneath the diffuser 30a. Accordingly, the lighting unit 12a and/or the sensor unit 16a is also arranged beneath the panel unit 10a. The sensor unit 16a is arranged between the lighting unit 12a and the panel unit 10a. The sensor unit 16a is arranged such that the sensor elements 20a, 22a point upwards, in particular to the diffuser 30a. The support element 18a thus points downwards, in particular to the lighting unit 12a. Accordingly, in the present case the sensor elements 20a, 22a are arranged above the support element 18a. In addition, in the present case each of the two sensor elements 20a, 22a is arranged at least essentially centrally beneath one of the markings 42a. There is at least one straight line which intersects at least one point of the sensor elements 20a, 22a, at least one point of the operating region 14a, in particular at least one point of one of the markings 42a and at least one point of the lighting unit 12a, in particular of the light guide 54a. In the present case the lighting unit 12a is intended to transilluminate the operating regions 14a, in particular the markings 42a.

In addition, the domestic appliance operating device has a printed board (not shown). The printed board is arranged beneath the lighting unit 12a. The light source 52a is directly soldered to the printed board. In addition, the light guide 54a is directly bonded to the printed board. In the present case the distance between the underside of the support element 18a and the light source 52a is approximately 0.5 cm. In the present case, the panel unit 10a is likewise fastened to the printed board by means of two spacers.

Alternatively, it is also conceivable to use a separate lighting unit and/or light source for each sensor element, which in particular can be arranged centrally in each case beneath a sensor element and/or a marking. In addition, it is also conceivable to arrange a light source at an angle of, for example, 90° to a longitudinal extension of a sensor unit so that light from the light source is supplied to the sensor unit, in particular via a curved light guide.

Figure 5:
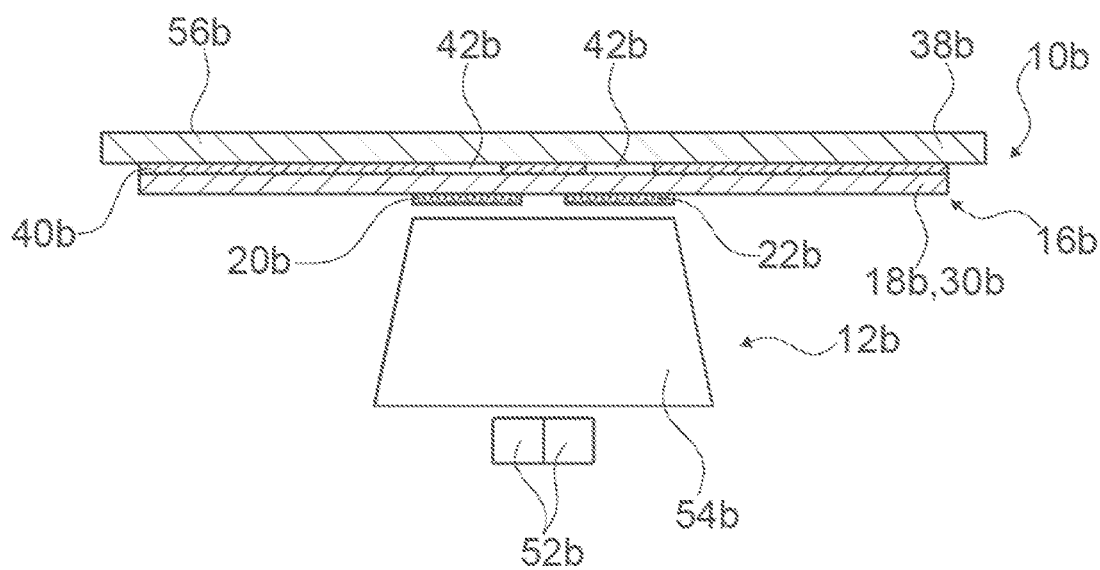

FIG. 5 shows a further exemplary embodiment of the invention. The following description and the drawing are essentially restricted to the differences between the exemplary embodiments, wherein with regard to the components with the same name, in particular with regard to components with the same reference characters, in principle reference can be made to the drawings and/or the description of the other exemplary embodiments, in particular the FIGS. 1 to 4. To distinguish the exemplary embodiments, the letter a follows the reference character of the exemplary embodiment in FIGS. 1 to 4. In the exemplary embodiment of FIG. 5 the letter a is replaced by the letter b.

FIG. 5 shows a further domestic appliance operating device. The domestic appliance operating device distinguishes itself at least essentially by means of an embodiment and an arrangement of a sensor unit 16b. The sensor unit 16b has a support element 18b. The support element 18b is made of a roughened plastic. In the present case the support element 18b is designed integrally with a diffuser 30b.

In addition, the domestic appliance operating device has a panel unit 10b with a glass ceramic plate 38b, a coating 40b and two markings 42b. The coating 40b and/or the markings 42b are arranged on the underside of the glass ceramic plate 38b.

Furthermore, the domestic appliance operating device has a lighting unit 12b. The lighting unit 12b in the present case has a light guide 54b. Furthermore, the lighting unit 12b has two light sources 52b. Both light sources 52b are intended to provide monochrome light. In the present case, both light sources 52b are intended to provide different colored light. One of the light sources 52b is intended to provide red light. The other light source 52b is intended to provide blue light.

The sensor unit 16b is arranged beneath the panel unit 10b and/or beneath the coating 40b. In addition, the sensor unit 16b is arranged above the lighting unit 12b. The sensor unit 16b is therefore arranged between the lighting unit 12b and the panel unit 10b. In the present case the sensor unit 16b is bonded to an underside of the coating 40b and/or the glass ceramic plate 38b of the panel unit 10b.

The sensor unit 16b is arranged such that the support element 18b points upwards, in particular to the panel unit 10b. The sensor elements 20b, 22b therefore point downwards, in particular to the lighting unit 12b. Accordingly, in the present case the sensor elements 20b, 22b are arranged beneath the support element 18b.

The invention claimed is:
1. An operating device for a domestic appliance, said operating device comprising:
   at least one panel unit having at least one operating region;
   a sensor unit disposed behind the panel unit, the sensor unit having:
      a partially transparent support element, and a sensor element arranged on the support element as an etched structure; and a lighting unit disposed behind the sensor unit, the lighting unit configured to illuminate the operating region through the sensor unit.

2. The operating device of claim 1, wherein the sensor element is at least essentially opaque.

3. The operating device of claim 1, wherein the sensor element has a plurality of electrically interconnected conductor tracks.

4. The operating device of claim 3, wherein the conductor tracks are arranged at least one of two ways, a first way in which the conductor tracks are arranged essentially in parallel, a second way in which the conductor tracks are arranged at least essentially in a grid shape.

5. The operating device of claim 3, wherein the conductor tracks have a line width of between 0.01 mm and 0.6 mm.

6. The operating device of claim 3, wherein the conductor tracks are at a mutual distance of between 0.05 mm and 1 mm.

7. The operating device of claim 1, wherein the sensor element occupies between 10% and 85% of a total surface of the support element.

8. The operating device of claim 1, wherein the sensor element, the operating region and the lighting unit are arranged such that at least one straight line intersects at least one point of the sensor element, at least one point of the operating region and at least one point of the lighting unit.

9. The operating device of claim 1, wherein support element is at least essentially flexible.

10. The operating device of claim 1, wherein the sensor unit has at least one supply line which is arranged on the support element as an etched structure.

11. The operating device of claim 1, further comprising at least one diffuser configured to prevent a direct view of the sensor element.

12. The operating device of claim 11, wherein the support element is formed in one piece with the at least one diffuser.

13. A domestic appliance having an operating device, the operating device comprising:

at least one panel unit having at least one operating region;

a sensor unit disposed behind the panel unit, the sensor unit having:

a partially transparent support element, and a sensor element arranged on the support element as an etched structure; and a lighting unit disposed behind the sensor unit, the lighting unit configured to illuminate the at least one operating region through the sensor unit.

14. The domestic appliance of claim 13, wherein the sensor element is at least essentially opaque.

15. The domestic appliance of claim 13, wherein the sensor element has a plurality of electrically interconnected conductor tracks.

16. The domestic appliance of claim 15, wherein the conductor tracks are arranged at least one of two ways, a first way in which the conductor tracks are arranged essentially in parallel, a second way in which the conductor tracks are arranged at least essentially in a grid shape.

17. The domestic appliance of claim 15, wherein the conductor tracks have a line width of between 0.01 mm and 0.6 mm.

18. The domestic appliance of claim 15, wherein the conductor tracks are at a mutual distance of between 0.05 mm and 1 mm.

19. The domestic appliance of claim 13, wherein the sensor element occupies between 10% and 85% of a total surface of the support element.

20. The domestic appliance of claim 13, wherein the sensor element, the operating region and the lighting unit are arranged such that at least one straight line intersects at least one point of the sensor element, at least one point of the operating region and at least one point of the lighting unit.

21. The domestic appliance of claim 13, wherein the support element is at least essentially flexible.

22. The domestic appliance of claim 13, wherein the sensor unit has at least one supply line which is arranged on the support element as an etched structure.

23. The domestic appliance of claim 13, wherein the operating device comprises at least one diffuser configured to prevent a direct view of the sensor element.

24. The domestic appliance of claim 23, wherein the support element is formed in one piece with the at least one diffuser.

* * * * *